United States Patent [19]
Evans, III et al.

[11] Patent Number: 5,983,468
[45] Date of Patent: Nov. 16, 1999

[54] ONE-PIECE CLIP FOR WAFFLE PACK CHIP HOLDERS

[75] Inventors: F. Lee Evans, III, Fremont; Alan L. Lause, Belmont, both of Calif.

[73] Assignee: Illinois Tool Works inc., Glenview, Ill.

[21] Appl. No.: 09/093,110

[22] Filed: Jun. 8, 1998

[51] Int. Cl.⁶ .................................................. H05K 7/20
[52] U.S. Cl. ............................ 24/457; 361/719; 24/570; 24/563; 24/510; 24/598.1; 439/329
[58] Field of Search ............................ 24/563, 570, 531, 24/545, 546, 547, 588, 598.1, 626; 439/329, 71; 361/719, 760, 807, 809, 764; 248/505, 510

[56] References Cited

U.S. PATENT DOCUMENTS

| | | | |
|---|---|---|---|
| 3,809,799 | 5/1974 | Taylor | 24/457 X |
| 4,598,965 | 7/1986 | Bricaud et al. | 439/68 |
| 5,329,426 | 7/1994 | Villani | 361/719 |
| 5,367,434 | 11/1994 | Griffin et al. | 361/719 |
| 5,594,624 | 1/1997 | Clemens | 361/704 |
| 5,640,762 | 6/1997 | Farnworth et al. | 439/71 X |
| 5,734,556 | 3/1998 | Saneinejad et al. | 24/589.1 X |
| 5,805,419 | 9/1998 | Hundt et al. | 361/719 |
| 5,818,695 | 10/1998 | Olson | 361/719 |

*Primary Examiner*—James R. Brittain
*Assistant Examiner*—Robert J. Sandy
*Attorney, Agent, or Firm*—Kane, Dalsimer, Sullivan and Levy, LLP

[57] ABSTRACT

The unitary clip for a tray and lid of a waffle pack includes a lower expanse with two upwardly extending hooks. The hooks include upper oblique surfaces which extend upwardly and outwardly. The upper oblique surfaces are immediately upwardly adjacent from inverted ledges which engage complementary portions of the lid of the waffle pack. The lower expanse is bowed so as to form a central apex which engages the lower planar portion of the waffle pack. The clip is engaged and disengaged from the waffle pack by a simple up and down motion.

4 Claims, 5 Drawing Sheets

ONE-PIECE CLIP FOR WAFFLE PACK CHIP HOLDERS

BACKGROUND OF INVENTION

1. Field of Invention

This invention pertains to a unitary clip for holding together a "waffle pack" of the type used for transporting and handling electronic chips.

2. Description of the Prior Art

In the prior art, "waffle packs" are used in the electronics and other industries to transport a variety of delicate electronic devices, predominately bare die, known good die (KGD), a more recently, chip scale packages (CSP). The "waffle pack" generally includes shallow pockets that are sized individually to properly contain the part while maintaining proper orientation without damage to the part. Typically, "waffle packs" are provided with a tray and a lid. Additionally, several tray elements may be stacked together to provide multiple storage levels.

Clips are required to hold the lid in place during shipping and handling. If the lid should lift from the tray, then parts would be able to move from their individual pockets. Any damage, loss, is misorientation of electronic chips can be very costly.

The prior art clips that are presently used require two parts to function properly. The two parts of the clip are engaged to the "waffle pack" and then the two parts are slid together so that protruding hooks on each part engage detent elements on the opposing part. The disengagement of these hooks is problematic in that unhooking the clips is a difficult manual process that requires dexterity, may be painful for the user's fingers, and risks the loss of control of the "waffle pack" tray set.

OBJECTS AND SUMMARY OF INVENTION

It is therefore an object of this invention to provide a clip for a waffle pack which will hold the waffle pack together securely.

It is therefore a further object of this invention to provide a clip for a waffle pack which allows the user to maintain control of the waffle pack during engagement and disengagement of the clip.

It is therefore a still further object of this invention to provide a clip for a waffle pack which can snap on and off of the tray set in a natural up and down motion.

These and other objects are attained by a unitary clip with a lower expanse and an upwardly extending hook on each end of the lower expanse. The lower expanse is slightly upwardly bowed so that the central portion is urged against the bottom of the waffle pack. Additionally, this upward bowing of the lower expanse in combination with the flexibility and resilience of the lower expanse provides an inward urging of the hooks in order to provide a detent mechanism between the hooks and the waffle pack. The lower expanse further includes leg portions on the ends thereof in order to raise the waffle pack and provide a degree of electrostatic protection. Upwardly and outwardly oblique surfaces on the distal ends of the hooks provides a surface to urge the hooks outwardly, for instance with a user's thumb, while maintaining a tight grip on the waffle pack. The clip of the present invention therefore provides a firm grip against the waffle pack, but car, be installed and removed easily with a simple up and down motion.

BRIEF DESCRIPTION OF THE DRAWINGS

Further objects and advantages of the invention will become apparent from the following description and claims, and from the accompanying drawings, wherein:

DETAILED DESCRIPTION OF THE PREFERRED EMBODIMENT

Figure 1:
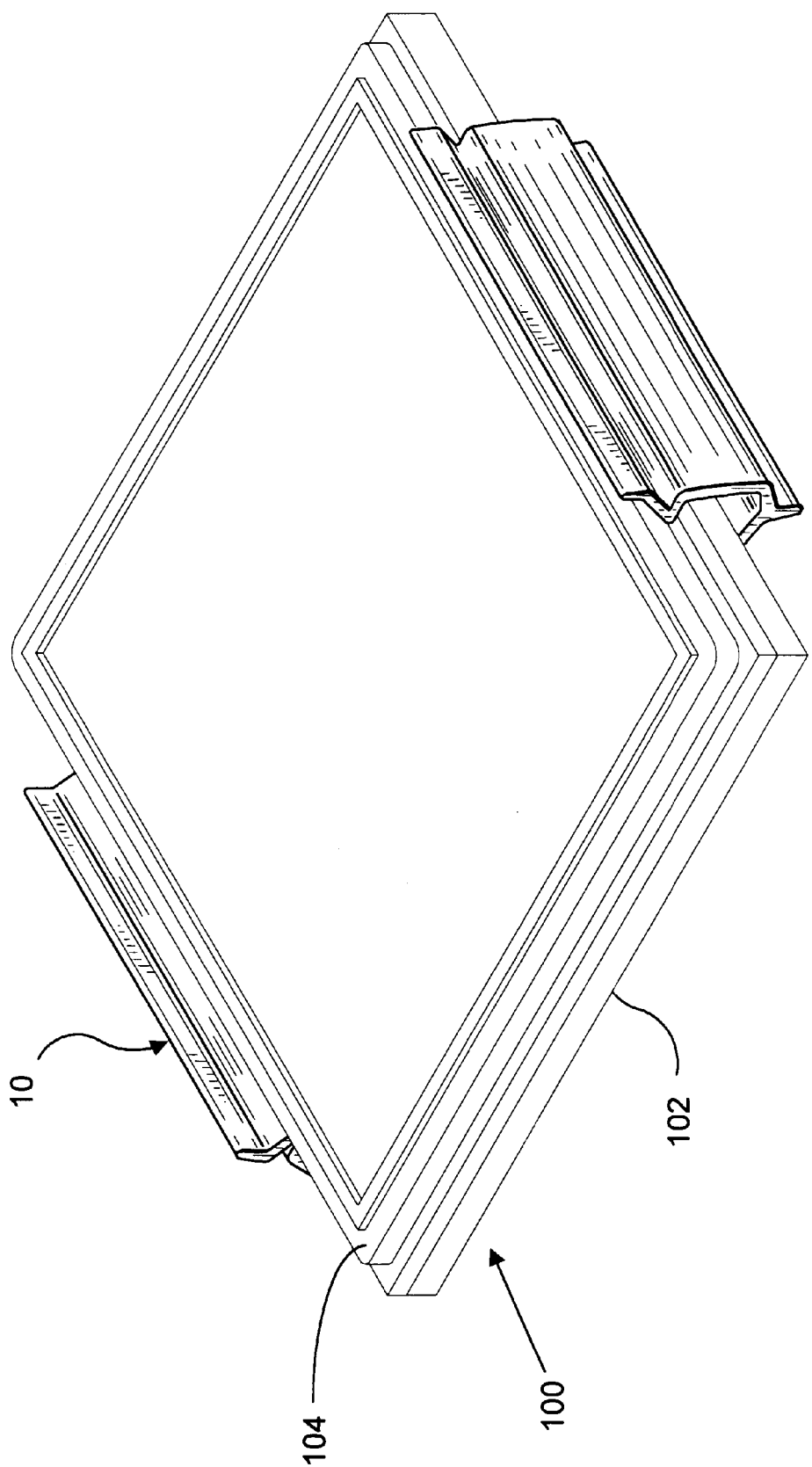
FIG. 1 is a top perspective view of the clip of the present invention, shown engaging a tray and a lid of the "waffle pack".
Figure 2:
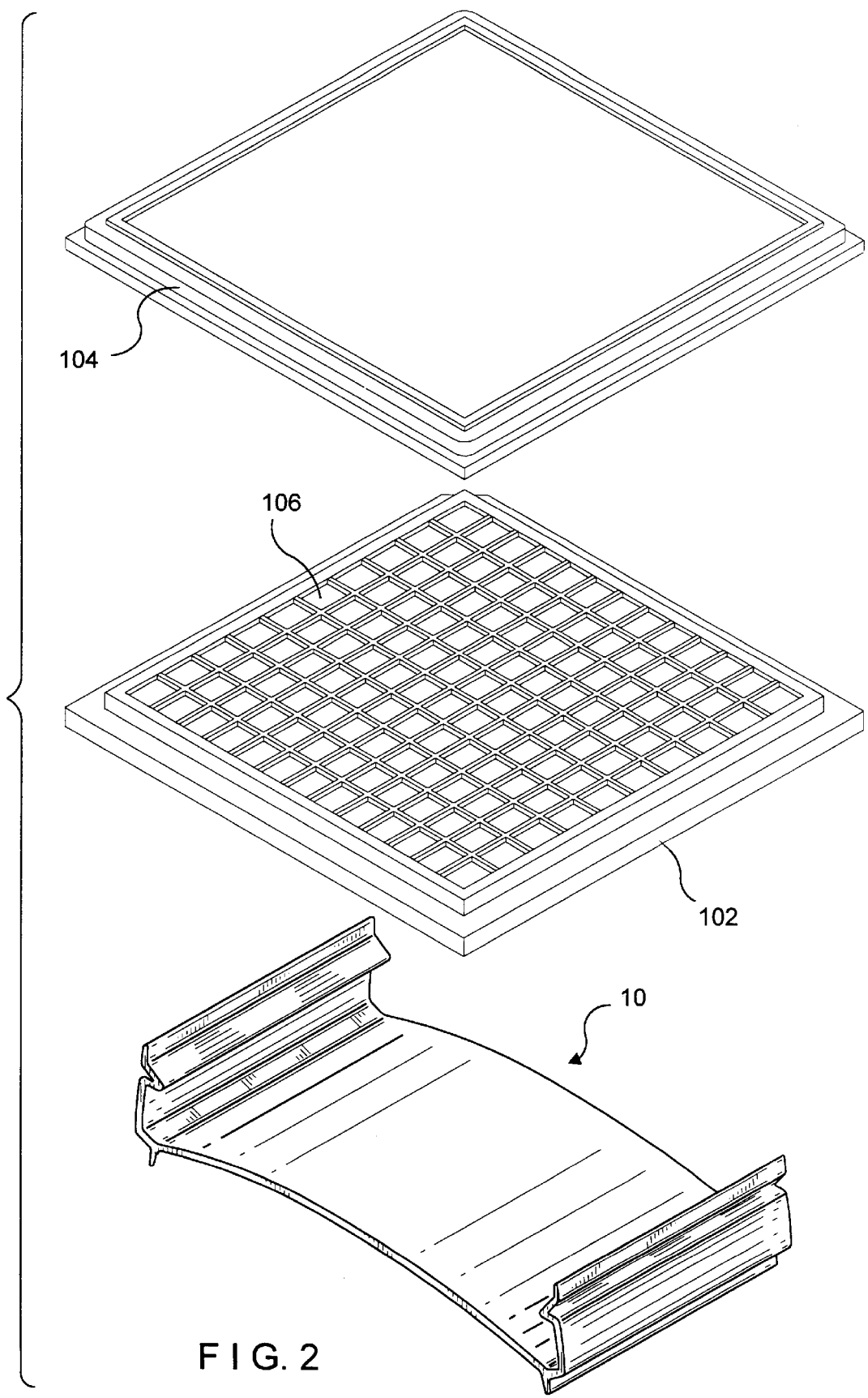
FIG. 2 is a top perspective exploded view of the clip of the present invention, along with the tray and lid of the "waffle pack".
Figure 3:
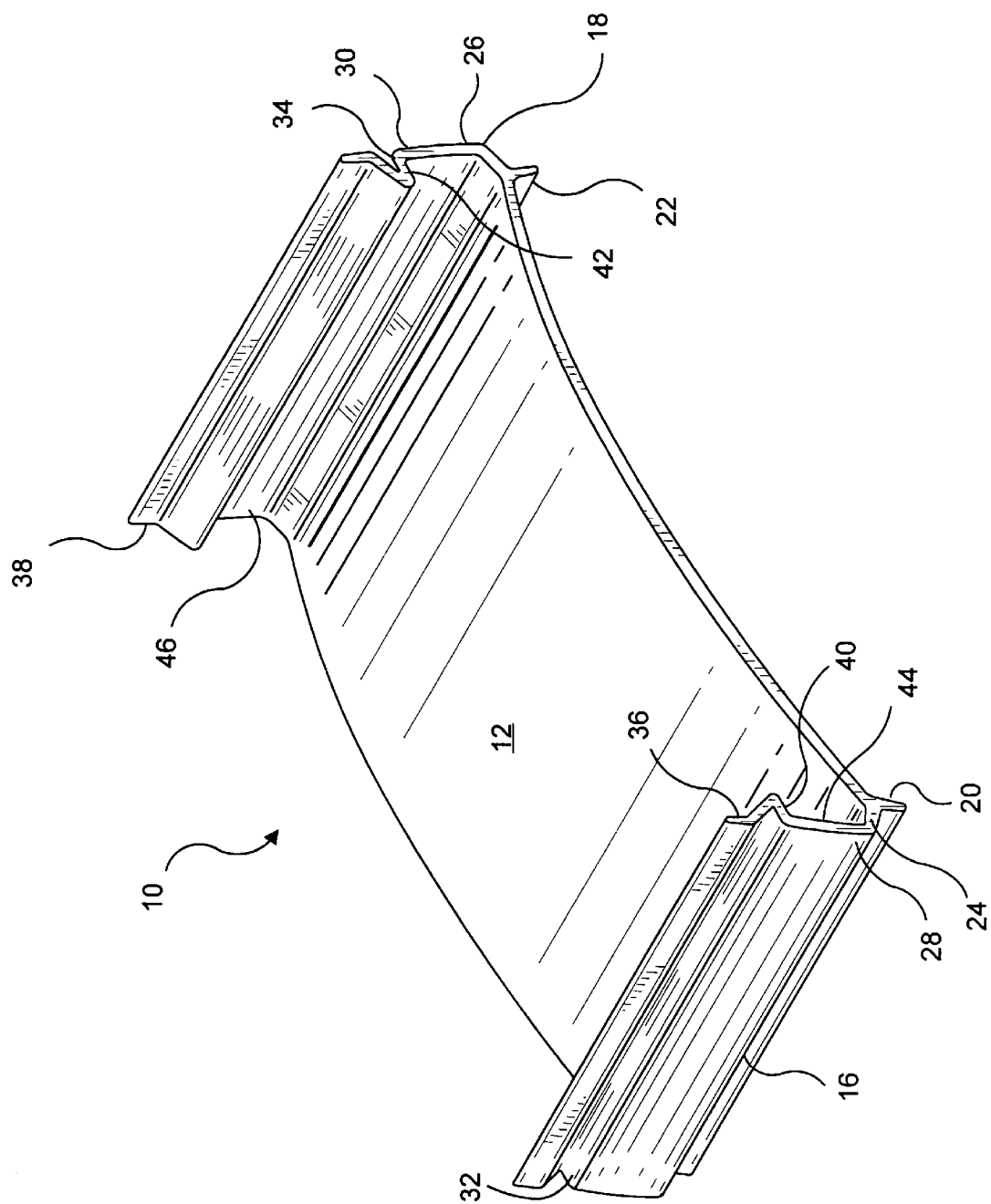
FIG. 3 is a top perspective view of the clip of the present invention.
Figure 4:
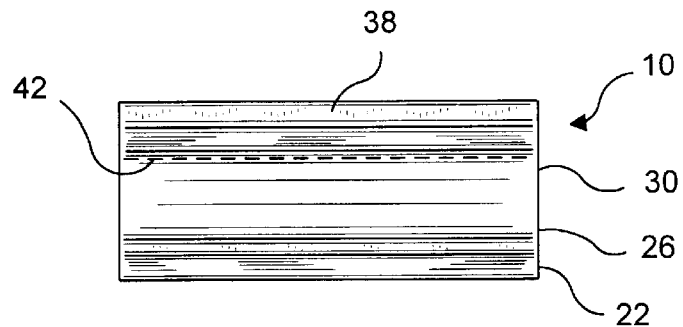
FIG. 4 is a side plan view of the clip of the present invention.
Figure 5:
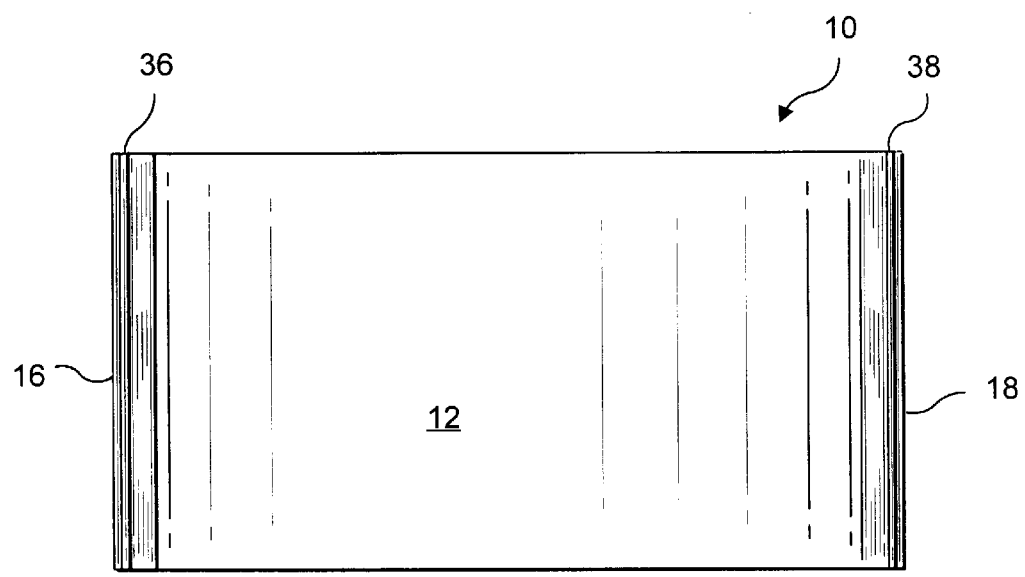
FIG. 5 is a top plan view of the clip of the present invention.
Figure 6:
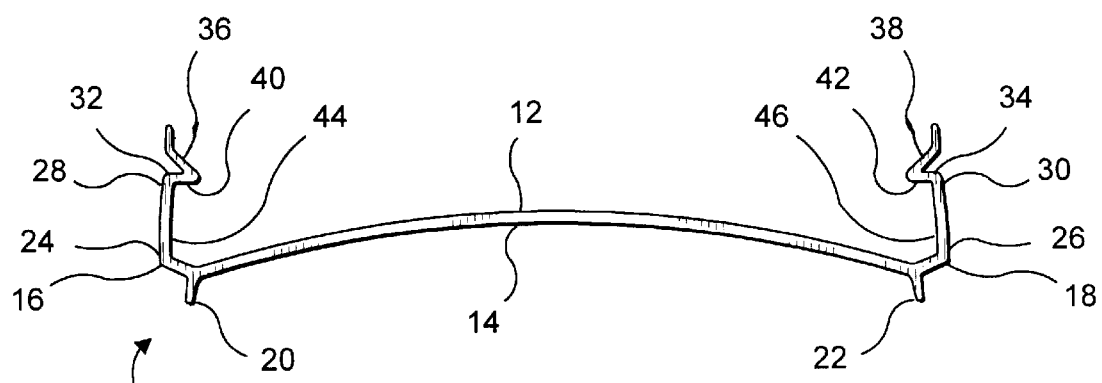
FIG. 6 is a front plan view of the clip of the present invention.
Figure 7:
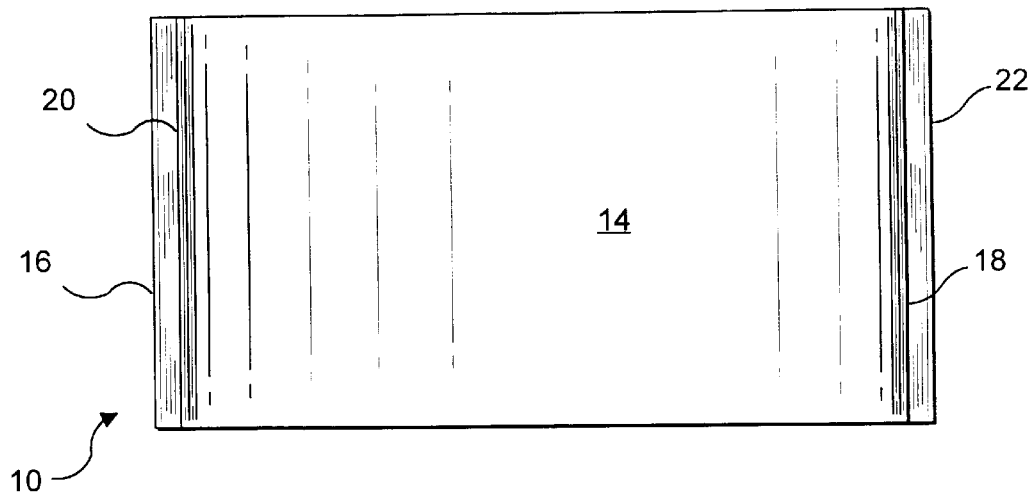
FIG. 7 is a bottom plan view of the clip of the present invention.

Referring now to the drawings in detail wherein like numerals refer to like elements throughout the several views, one sees that FIG. 1 is a top perspective view of clip 10 of the present invention along with waffle pack 100 which includes tray 102 and lid 104. FIG. 2 provides a view of the interior pockets 106 of tray 102 which are used to hold electronic components.

Clip 10 is typically made from plastic, such as clear rigid PVC, with a substantial degree of flexibility and resilience in order for clip 10 to engage and disengage from waffle pack 100. Waffle pack 100 is typically made from relatively rigid plastic, as is known in the prior art.

As shown in the accompanying figures, clip 10 includes lower expanse 12 which is upwardly bowed. The central apex 14 of lower expanse 12 engages against the lower planar face 108 of tray 102 of waffle pack 100. Ends 16, 18 of lower expanse 12 include downwardly extending leg portions 20, 22. These leg portions 20, 22 serve to offset clip 10 and waffle pack 100 from a stationary surface (not shown) and therefore provide a degree of electrostatic protection for the chips held with pockets 106 of tray 102 of waffle pack 100.

Ends 16, 18 of lower expanse 12 are integral with lower proximal ends 24, 26 of upwardly extending hooks 28, 30, respectively. Upper distal ends 32, 34 of upwardly extending hooks 28, 30 include oblique surfaces 36, 38 to allow a user to urge hooks 28, 30 easily and gently apart during the disengagement process while maintaining a firm grip on the waffle pack. Additionally, during the engagement process, when clip 10 is urged against waffle pack 100, waffle pack 100 presses against oblique surfaces 36, 38 thereby urging hooks 28, 30 apart so that waffle pack 100 can pass between hooks 28, 30 and become engaged therebetween.

Figure 8:
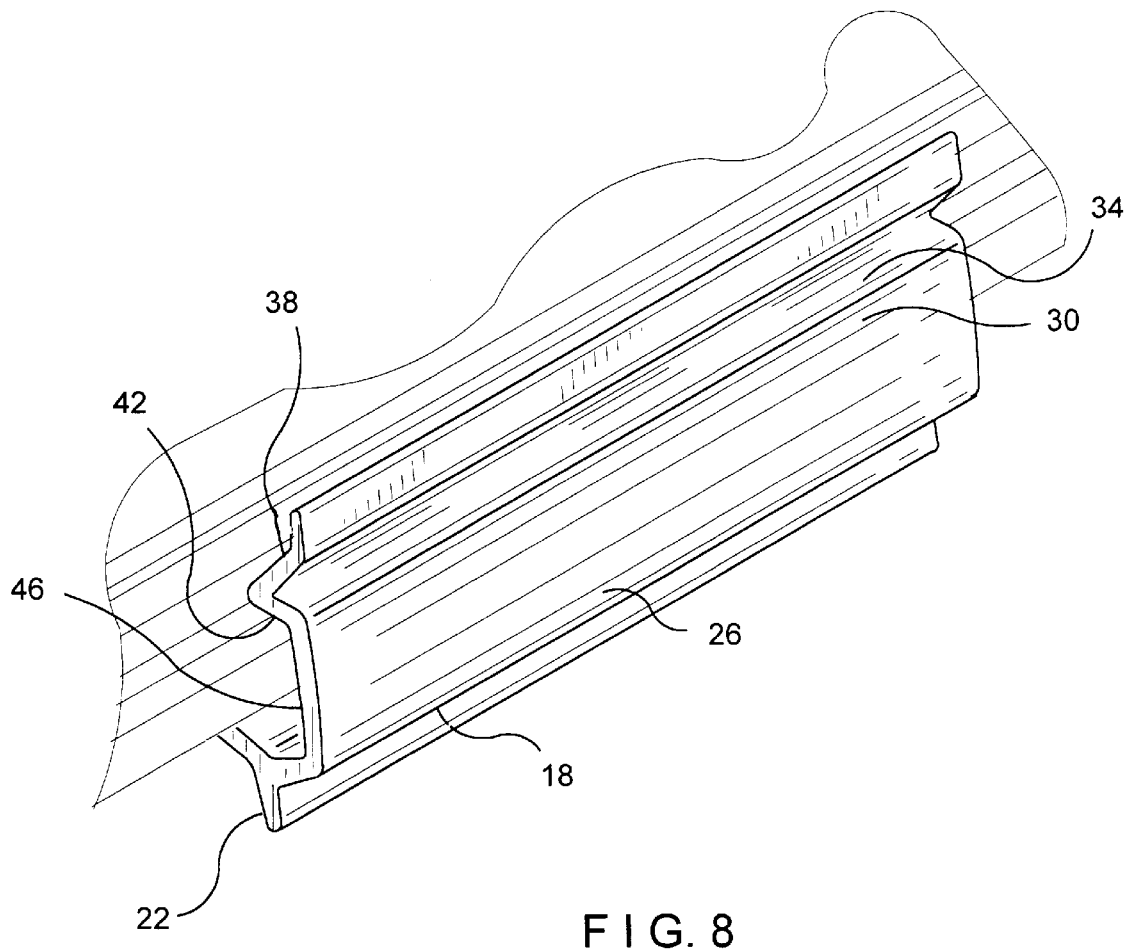
FIG. 8 is a detailed view of the engagement of the clip to the tray and lid of the "waffle pack".

As shown in detail in FIG. 8, immediately downwardly adjacent from oblique surfaces 36, 38 are detent inverted ledge surfaces 40, 42 which engage complementary ledge surface 110 of upper planar surface 112 of lid 104 of waffle pack 100. Engagement sections 44, 46 are formed between detent inverted ledge surfaces 40, 42 and lower proximal ends 24, 26.

In order to use clip 10 in combination with waffle pack 100, the user receives the waffle pack 100 typically with electronic components (not shown). The user then urges clip 10 onto waffle pack 100, so that waffle pack 100 first contacts at least one of oblique surfaces 36, 38 (and possibly an opposing engagement section 44 or 46) so that upwardly extending hooks 28, 30 are spread apart and waffle pack 100 becomes engaged by engagement sections 44, 46 of upwardly extending hooks 28, 30. Additionally, central apex 14 of lower expanse 12 of clip 10 urges against the lower planar face 108 of tray 102 of waffle pack 100.

To remove clip 10 from waffle pack 100, the user typically holds waffle pack 100 with both hands and slides one thumb across upper planar surface 112 of lid 104 of waffle pack 100 and against one of oblique surfaces 36, 38 to disengage upwardly extending hooks 28, 30 from waffle pack 100. This operation allows the user to maintain a secure manual grip on the waffle pack 100 during disengagement of clip 100.

While clip 10 is illustrated with a two-piece waffle pack 100, upwardly extending hooks 28, 30 can be extended so as to enlarge engagement sections 44, 46, thereby allowing clip 10 to be used with a waffle pack 100 including a plurality of successive trays 102.

Thus the several aforementioned objects and advantages are most effectively attained. Although a single preferred embodiment of the invention has been disclosed and described in detail herein, it should be understood that this invention is in no sense limited thereby and its scope is to be determined by that of the appended claims.

What is claimed is:

1. A clip for securing a tray and lid of a waffle pack, the clip comprising:

a lower expanse with a first end and a second end, said first and second ends including respective first and second downwardly extending legs, said lower expanse being upwardly bowed thereby forming a central apex configured to engage a lower planar surface of the waffle pack;

a first hook section having a first proximal end and a first distal end;

a second hook section having a second proximal end and second distal end;

said first proximal end of said first hook section extending upwardly from said first end of said lower expanse;

said second proximal end of said second hook section extending upwardly from said second end of said lower expanse;

said first distal end including a first detent element further including a first inverted ledge surface immediately upwardly adjacent from a first oblique surface, said first oblique surface extending upwardly and outwardly from said first inverted ledge surface;

said second distal end including a second detent element further including a second inverted ledge surface immediately downwardly adjacent from a second oblique surface, said second oblique surface extending upwardly and outwardly from said second inverted ledge surface;

said first and second inverted ledge surfaces being shaped to engage complementary portions of the waffle pack; and wherein a first engagement portion is formed between said first inverted ledge surface and said first proximal end, and wherein a second engagement portion is formed between said second inverted ledge surface and said second proximal end, and said first and second engagement portions are shaped to engage sides of the waffle pack.

2. The clip of claim 1 wherein the clip is unitary.

3. The clip of claim 2 wherein the clip is formed of flexible and resilient plastic.

4. The clip of claim 3 wherein the clip engages and disengages from the waffle pack substantially free of lateral motion other than movement of said first and second hook sections away from and toward the waffle pack.

* * * * *